(12) United States Patent
Lopez et al.

(10) Patent No.: US 12,431,478 B2
(45) Date of Patent: *Sep. 30, 2025

(54) HYBRID CMOS MICRO-LED DISPLAY LAYOUT

(71) Applicant: Lumileds LLC, San Jose, CA (US)

(72) Inventors: Toni Lopez, Vaals (NL); Florent Monestier, Aachen (DE)

(73) Assignee: LUMILEDS SINGAPORE PTE. LTD., Singapore (SG)

(*) Notice: Subject to any disclaimer, the term of this patent is extended or adjusted under 35 U.S.C. 154(b) by 488 days.

This patent is subject to a terminal disclaimer.

(21) Appl. No.: 17/947,327

(22) Filed: Sep. 19, 2022

(65) Prior Publication Data
US 2023/0101822 A1    Mar. 30, 2023

Related U.S. Application Data

(60) Provisional application No. 63/249,785, filed on Sep. 29, 2021.

(51) Int. Cl.
*H01L 25/16*   (2023.01)
*H01L 25/075*  (2006.01)
*H10H 20/857*  (2025.01)

(52) U.S. Cl.
CPC ........ *H01L 25/167* (2013.01); *H01L 25/0753* (2013.01); *H10H 20/857* (2025.01)

(58) Field of Classification Search
CPC . H01L 25/167; H01L 25/0753; H10H 20/857; G09G 3/32; G09G 2300/0426; G09G 2330/00
See application file for complete search history.

(56) References Cited

U.S. PATENT DOCUMENTS

| | | |
|---|---|---|
| 6,410,942 B1 | 6/2002 | Thibeault et al. |
| 6,657,236 B1 | 12/2003 | Thibeault et al. |
| | (Continued) | |

FOREIGN PATENT DOCUMENTS

| | | |
|---|---|---|
| DE | 102010051286 A1 | 5/2012 |
| DE | 102012109460 A1 | 4/2014 |
| | (Continued) | |

OTHER PUBLICATIONS

PCT International Search Report and Written Opinion in PCT/US2022/044327 dated Jan. 12, 2023, 11 pages.

(Continued)

*Primary Examiner* — Victor A Mandala
(74) *Attorney, Agent, or Firm* — SERVILLA WHITNEY LLC

(57) ABSTRACT

Described is a CMOS power plane including interleaving contact areas, alternating $V_{led}$ and $V_{cat}$ contact areas, on at least two long sides of the μLED display area. By this way, $V_{led}$ and cathode current are injected uniformly along the four sides of the μLED display panel. A large cathode current distribution ring on $V_{led}$ and $V_{cat}$ circuits is used to distribute the current along the four sides of the panel. The current distribution ring surrounds a pixel die area. An insulated area may be included on the cathode current redistribution ring adjacent one of the of μbumps.

18 Claims, 7 Drawing Sheets
(2 of 7 Drawing Sheet(s) Filed in Color)

(56) References Cited

U.S. PATENT DOCUMENTS

| | | | |
|---|---|---|---|
| 6,821,804 B2 | 11/2004 | Thibeault et al. |
| 8,222,811 B2 | 7/2012 | Vaufrey et al. |
| 8,258,044 B2 | 9/2012 | Brun et al. |
| 8,487,340 B2 | 7/2013 | Gilet et al. |
| 8,638,032 B2 | 1/2014 | Maindron et al. |
| 8,647,957 B2 | 2/2014 | Borowik et al. |
| 8,697,548 B2 | 4/2014 | Borowik et al. |
| 8,698,396 B2 | 4/2014 | Maindron et al. |
| 8,890,111 B2 | 11/2014 | Templier et al. |
| 9,093,607 B2 | 7/2015 | Gilet et al. |
| 9,109,296 B2 | 8/2015 | Metaye et al. |
| 9,112,112 B2 | 8/2015 | Do et al. |
| 9,192,290 B2 | 11/2015 | Spinnler et al. |
| 9,209,366 B2 | 12/2015 | Maindron et al. |
| 9,263,633 B2 | 2/2016 | Gilet et al. |
| 9,396,970 B2 | 7/2016 | Gillot et al. |
| 9,422,628 B2 | 8/2016 | Simonato et al. |
| 9,496,465 B2 | 11/2016 | Sugimoto et al. |
| 9,507,204 B2 | 11/2016 | Pelka et al. |
| 9,601,542 B2 | 3/2017 | Robin et al. |
| 9,722,160 B2 | 8/2017 | Nakabayashi |
| 9,768,350 B2 | 9/2017 | Bavencove et al. |
| 9,887,184 B2 | 2/2018 | Takeya et al. |
| 9,945,526 B2 | 4/2018 | Singer et al. |
| 9,978,727 B2 | 5/2018 | Takeya et al. |
| 9,997,688 B2 | 6/2018 | Takeya et al. |
| 10,002,928 B1 | 6/2018 | Raring et al. |
| 10,018,325 B2 | 7/2018 | Kim et al. |
| 10,050,026 B2 | 8/2018 | Takeya et al. |
| 10,068,884 B2 | 9/2018 | Takeya et al. |
| 10,145,518 B2 | 12/2018 | Do et al. |
| 10,964,845 B2 | 3/2021 | Dimitropoulos et al. |
| 11,621,173 B2* | 4/2023 | Hin .................. H01L 21/6835 362/555 |
| 11,631,594 B2* | 4/2023 | Hin .................. H10H 20/858 438/23 |
| 2009/0179831 A1 | 7/2009 | Yamashita et al. |
| 2011/0151607 A1 | 6/2011 | Landis et al. |
| 2011/0287606 A1 | 11/2011 | Brun et al. |
| 2012/0007134 A1 | 1/2012 | Miyai et al. |
| 2012/0205614 A1 | 8/2012 | Templier et al. |
| 2012/0223875 A1* | 9/2012 | Lau .................. H05B 45/44 345/82 |
| 2013/0020115 A1 | 1/2013 | Mataye et al. |
| 2013/0112945 A1 | 5/2013 | Gilet et al. |
| 2014/0077156 A1 | 3/2014 | Bavencove et al. |
| 2014/0094878 A1 | 4/2014 | Gossler et al. |
| 2014/0138719 A1 | 5/2014 | Maindron et al. |
| 2014/0367705 A1 | 12/2014 | Bibl et al. |
| 2015/0118544 A1 | 4/2015 | Oukassi |
| 2015/0144590 A1 | 5/2015 | Simonato et al. |
| 2015/0187740 A1 | 7/2015 | Mcgroddy et al. |
| 2015/0228873 A1 | 8/2015 | Gebuhr et al. |
| 2015/0280060 A1 | 10/2015 | Gilet et al. |
| 2015/0380461 A1 | 12/2015 | Robin et al. |
| 2016/0079565 A1 | 3/2016 | Maindron et al. |
| 2016/0190400 A1 | 6/2016 | Jung et al. |
| 2016/0218240 A1 | 7/2016 | Bouvier et al. |
| 2016/0293811 A1 | 10/2016 | Hussell et al. |
| 2017/0080457 A1 | 3/2017 | Eymery et al. |
| 2017/0098746 A1 | 4/2017 | Bergmann et al. |
| 2017/0137645 A1 | 5/2017 | Manceau et al. |
| 2017/0186612 A1 | 6/2017 | Almadori et al. |
| 2017/0243860 A1 | 8/2017 | Hong et al. |
| 2017/0293065 A1 | 10/2017 | Kim |
| 2017/0358563 A1 | 12/2017 | Cho et al. |
| 2017/0358724 A1 | 12/2017 | Shichijo et al. |
| 2018/0017939 A1 | 1/2018 | Allier et al. |
| 2018/0019369 A1 | 1/2018 | Cho et al. |
| 2018/0019373 A1 | 1/2018 | Lehnhardt et al. |
| 2018/0061316 A1 | 3/2018 | Shin et al. |
| 2018/0074372 A1 | 3/2018 | Takeya et al. |
| 2018/0090540 A1 | 3/2018 | Von Malm et al. |
| 2018/0138157 A1 | 5/2018 | Im et al. |
| 2018/0145059 A1 | 5/2018 | Welch et al. |
| 2018/0149328 A1 | 5/2018 | Cho et al. |
| 2018/0156406 A1 | 6/2018 | Feil et al. |
| 2018/0166470 A1 | 6/2018 | Chae |
| 2018/0174519 A1 | 6/2018 | Kim et al. |
| 2018/0174931 A1 | 6/2018 | Henley |
| 2018/0210282 A1 | 7/2018 | Song et al. |
| 2018/0238511 A1 | 8/2018 | Hartmann et al. |
| 2018/0259137 A1 | 9/2018 | Lee et al. |
| 2018/0259570 A1 | 9/2018 | Henley |
| 2018/0272605 A1 | 9/2018 | Gmeinsieser et al. |
| 2018/0283642 A1 | 10/2018 | Liao et al. |
| 2018/0297510 A1 | 10/2018 | Fiederling et al. |
| 2018/0339643 A1 | 11/2018 | Kim |
| 2018/0339644 A1 | 11/2018 | Kim |
| 2018/0354406 A1 | 12/2018 | Park |
| 2021/0148553 A1 | 5/2021 | Hin et al. |
| 2022/0037303 A1* | 2/2022 | Aoki .................. G09G 3/32 |
| 2023/0099850 A1* | 3/2023 | Lopez .................. H01L 25/0753 257/79 |
| 2023/0101822 A1 | 3/2023 | Lopez et al. |
| 2023/0118272 A1* | 4/2023 | Lopez .................. H10H 20/8312 257/79 |
| 2023/0126041 A1* | 4/2023 | Wildeson .................. H10H 29/30 438/4 |

FOREIGN PATENT DOCUMENTS

| | | |
|---|---|---|
| DE | 102014112551 A1 | 3/2016 |
| EP | 1378949 A1 | 1/2004 |
| EP | 2027608 A1 | 2/2009 |
| EP | 2203939 A1 | 7/2010 |
| EP | 2211387 A2 | 7/2010 |
| EP | 2339658 A2 | 6/2011 |
| EP | 2491591 A1 | 8/2012 |
| EP | 2499958 A1 | 9/2012 |
| EP | 2521161 A1 | 11/2012 |
| EP | 2521162 A1 | 11/2012 |
| EP | 2553149 A1 | 2/2013 |
| EP | 2617069 A1 | 7/2013 |
| EP | 2674516 A1 | 12/2013 |
| EP | 2855744 B1 | 5/2016 |
| EP | 3053199 A1 | 8/2016 |
| EP | 3144272 A1 | 3/2017 |
| EP | 2006921 B1 | 12/2018 |
| EP | 3410002 A1 | 12/2018 |
| EP | 3410003 A1 | 12/2018 |
| EP | 2710634 B1 | 10/2020 |
| FR | 2952366 A1 | 5/2011 |
| FR | 2964796 A1 | 3/2012 |
| FR | 2969995 A1 | 7/2012 |
| FR | 2972815 A1 | 9/2012 |
| FR | 2974940 A1 | 11/2012 |
| FR | 2974941 A1 | 11/2012 |
| FR | 2975532 A1 | 11/2012 |
| FR | 2991342 A1 | 12/2013 |
| FR | 2991999 A1 | 12/2013 |
| FR | 2998090 A1 | 5/2014 |
| FR | 3011383 A1 | 4/2015 |
| FR | 3041274 A1 | 3/2017 |
| FR | 3046155 A1 | 6/2017 |
| FR | 3052915 A1 | 12/2017 |
| JP | 2016066765 A | 4/2016 |
| KR | 20140118466 A | 10/2014 |
| KR | 20170017122 A | 2/2017 |
| KR | 20170018687 A | 2/2017 |
| KR | 20180010670 A | 1/2018 |
| KR | 20180114413 A | 10/2018 |
| TW | 201417339 A | 5/2014 |
| TW | 201620163 A | 6/2016 |
| WO | 2006138465 A2 | 12/2006 |
| WO | 2011045289 A1 | 4/2011 |
| WO | 2011048318 A1 | 4/2011 |
| WO | 2012035243 A1 | 3/2012 |
| WO | 2012156620 A2 | 11/2012 |
| WO | 2013182969 A1 | 12/2013 |
| WO | 2015044620 A1 | 4/2015 |
| WO | 2016079505 A1 | 5/2016 |
| WO | 2017068029 A1 | 4/2017 |
| WO | 2017102708 A1 | 6/2017 |

(56) References Cited

FOREIGN PATENT DOCUMENTS

| WO | 2017184686 A1 | 10/2017 |
| WO | 2017216445 A1 | 12/2017 |
| WO | 2018091657 A1 | 5/2018 |
| WO | 2018139866 A1 | 8/2018 |
| WO | 2018143682 A1 | 8/2018 |
| WO | 2018159977 A1 | 9/2018 |
| WO | 2018169243 A1 | 9/2018 |
| WO | 2019092357 A1 | 5/2019 |
| WO | 2019126539 A1 | 6/2019 |

OTHER PUBLICATIONS

PCT International Search Report and Written Opinion in PCT/US2022/044328 dated Jan. 9, 2023, 12 pages.
PCT International Search Report and Written Opinion in PCT/US2022/044329 dated Jan. 18, 2023, 10 pages.
Herrnsdorf, Johannes , et al., "Active-Matrix GaN Micro Light-Emitting Diode Display With Unprecedented Brightness", IEEE Transactions on Electron Devices, vol. 62, No. 6, Jun. 2015.

* cited by examiner

HYBRID CMOS MICRO-LED DISPLAY LAYOUT

CROSS-REFERENCE TO RELATED APPLICATIONS

This application claims priority to U.S. Provisional Application No. 63/249,785, filed Sep. 29, 2021, the entire disclosure of which is hereby incorporated by reference herein.

TECHNICAL FIELD

Embodiments of the disclosure generally relate to light emitting diode (LED) devices. More particularly, embodiments are directed to a layout structure for CMOS driver electronics for the individual control of pixel brightness of microLEDs.

BACKGROUND

A light emitting diode (LED) is a semiconductor light source that emits visible light when current flows through it. LEDs combine a P-type semiconductor with an N-type semiconductor. LEDs commonly use a III-group compound semiconductor. A III-group compound semiconductor provides stable operation at a higher temperature than devices that use other semiconductors. The III-group compound is typically formed on a substrate formed of sapphire or silicon carbide (SiC).

LEDs have emerged as an appealing light source for many applications. From road signage and traffic signals, LEDs are currently becoming dominant in general lighting, automotive, mobile electronics, camera flash, display backlighting, horticulture, and sanitization applications. Typical benefits of LEDs compared to competing light sources are increased efficiency, longer lifespan, and adaptability to a large variety of form factors.

Highly compact pixelated light emitting diode (LED) devices, e.g., arrays of microLEDs for advanced automotive forward lighting, may comprise a monolithic large area, high power LED die hybridized with CMOS driver electronics for the individual control of pixel brightness. Linear driving schemes are among the most practical solutions for such control electronics, particularly for large pixel array configurations.

A difficulty associated with this system concerns the CMOS routing for the interconnection of all pixel contacts to the power supply and integrated circuit driver. Cost effective solutions must minimize the number of metal layers for the power planes. Minimizing the number of metal layers for the power planes, however, may compromise the performance of the layout to uniformly distribute current uniformly, leading to undesirable current crowding effects with excessive current density levels negatively affecting heat losses and reliability associated to electromigration at contact interfaces.

There is a need, therefore, for a layout architecture that optimizes current distribution in a hybridized LED die/CMOS monolithic architecture.

SUMMARY

Techniques and Embodiments of the disclosure are directed to CMOS power planes. In one or more embodiments, a CMOS power plane comprises: a cathode redistribution ring having an inner portion and an outer portion, the inner portion surrounding a perimeter of a die pixel area, the outer portion comprising area common supply voltage $V_{led}$ interleaved with a cathode current distribution area; and a plurality of cathode µbumps contacting the inner portion of the cathode redistribution ring along the perimeter of the die pixel area.

Other embodiments of the disclosure are directed to CMOS layouts. In one or more embodiments, a CMOS layout comprises: a power plane on a substrate, the power plane having a plurality of alternating $V_{led}$ contact areas and cathode contact areas uniformly dispersed along at least two sides of the power plane; a cathode current redistribution ring extending along four sides of the power plane; a plurality of cathode µbumps connecting each of the plurality of alternating $V_{led}$ contact areas and cathode contact areas to a corresponding p contact of a plurality of pixels; and a common cathode grid electrically connecting the plurality of pixels and the plurality of µbumps.

Further embodiments are directed to a CMOS power plane. In one or more embodiments, a CMOS power plane comprises: a cathode redistribution ring having an inner portion and an outer portion, the inner portion surrounding a perimeter of a die pixel area, the outer portion comprising area common supply voltage $V_{led}$ interleaved with a cathode current distribution area along a first side, a second side, a third side, and a fourth side of the CMOS power plane; and a plurality of cathode µbumps contacting the inner portion of the cathode redistribution ring along the perimeter of the die pixel area.

Additional embodiments are directed to CMOS layouts. In one or more embodiments, a CMOS layout comprises: a power plane on a substrate, the power plane having a plurality of alternating $V_{led}$ contact areas and cathode contact areas dispersed along a first side, a second side, a third side, and a fourth side of the power plane; a cathode current redistribution ring extending along the first side, the second side, the third side, and the fourth side of the power plane; a plurality of cathode µbumps connecting each of the plurality of alternating $V_{led}$ contact areas and cathode contact areas to a corresponding p contact of a plurality of pixels; and a common cathode grid electrically connecting the plurality of pixels and the plurality of cathode µbumps.

Other embodiments are directed to a CMOS power plane. In one or more embodiments, a CMOS power plane comprises: a cathode redistribution ring having an inner portion and an outer portion, the inner portion surrounding a perimeter of a die pixel area, the outer portion comprising area common supply voltage $V_{led}$ interleaved with a cathode current distribution area; a plurality of cathode µbumps contacting the inner portion of the cathode redistribution ring along the perimeter of the die pixel area; and an insulated area on the cathode redistribution ring adjacent one of the plurality of cathode µbumps.

Additional embodiments are directed to CMOS layouts. In one or more embodiments, a CMOS layout comprise: a power plane on a substrate, the power plane having a plurality of alternating $V_{led}$ contact areas and cathode contact areas uniformly dispersed along at least two sides of the power plane; a cathode current redistribution ring extending along four sides of the power plane; a plurality of cathode µbumps connecting each of the plurality of alternating $V_{led}$ contact areas and cathode contact areas to a corresponding p contact of a plurality of pixels; an insulated area on the cathode current redistribution ring adjacent one of the plurality of cathode µbumps; and a common cathode grid electrically connecting the plurality of pixels and the plurality of cathode µbumps.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

The patent or application file contains at least one drawing executed in color. Copies of this patent or patent application publication with color drawing(s) will be provided by Office upon request and payment of the necessary fee.

To facilitate understanding, identical reference numerals have been used, where possible, to designate identical elements that are common to the figures. The figures are not drawn to scale. For example, the heights and widths of the mesas are not drawn to scale.

DETAILED DESCRIPTION

Figure 1A:
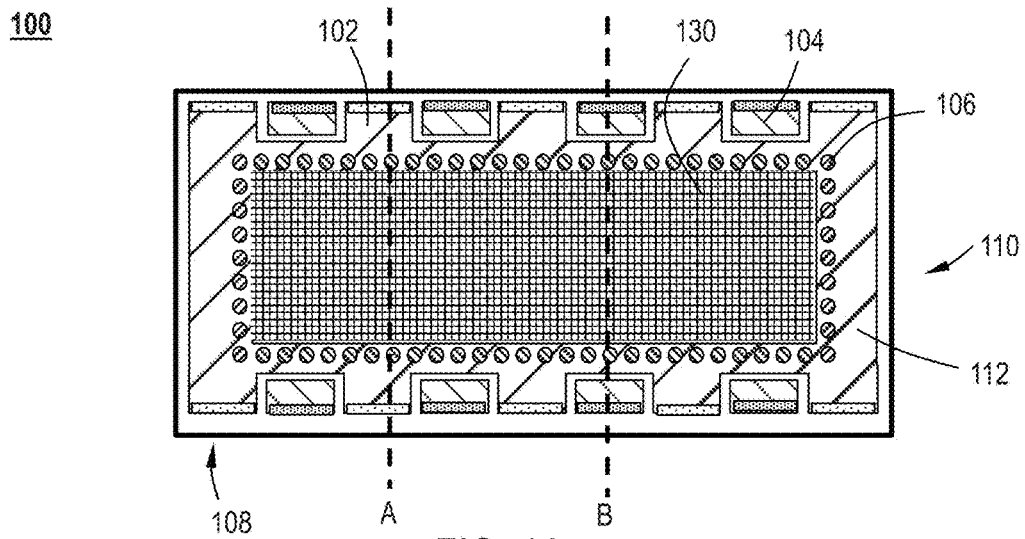
FIG. 1A illustrates a top view of the CMOS top layer of a CMOS power plane according to one or more embodiments.

Before describing several exemplary embodiments of the disclosure, it is to be understood that the disclosure is not limited to the details of construction or process steps set forth in the following description. The disclosure is capable of other embodiments and of being practiced or being carried out in various ways.

The term "substrate" as used herein according to one or more embodiments refers to a structure, intermediate or final, having a surface, or portion of a surface, upon which a process acts. In addition, reference to a substrate in some embodiments also refers to only a portion of the substrate, unless the context clearly indicates otherwise. Further, reference to depositing on a substrate according to some embodiments includes depositing on a bare substrate or on a substrate with one or more layers, films, features, or materials deposited or formed thereon.

In one or more embodiments, the "substrate" means any substrate or material surface formed on a substrate upon which film processing is performed during a fabrication process. In exemplary embodiments, a substrate surface on which processing is performed includes materials such as silicon, silicon oxide, silicon on insulator (SOI), strained silicon, amorphous silicon, doped silicon, carbon doped silicon oxides, germanium, gallium arsenide, glass, sapphire, and any other suitable materials such as metals, metal nitrides, III-nitrides (e.g., GaN, AlN, InN, and other alloys), metal alloys, and other conductive materials, depending on the application. Substrates include, without limitation, light emitting diode (LED) devices. Substrates in some embodiments are exposed to a pretreatment process to polish, etch, reduce, oxidize, hydroxylate, anneal, UV cure, e-beam cure and/or bake the substrate surface. In addition to film processing directly on the surface of the substrate itself, in some embodiments, any of the film processing steps disclosed is also performed on an underlayer formed on the substrate, and the term "substrate surface" is intended to include such underlayer as the context indicates. Thus, for example, where a film/layer or partial film/layer has been deposited onto a substrate surface, the exposed surface of the newly deposited film/layer becomes the substrate surface.

The term "wafer" and "substrate" will be used interchangeably in the instant disclosure. Thus, as used herein, a wafer serves as the substrate for the formation of the LED devices described herein.

In order to deploy LEDs for high density display applications or for large area, medium density applications, the LED unit is desired to have a characteristic dimension of 100 micrometers or less, with typical values in the 8 to 25 micrometer range. This class of LEDs is commonly referred to as micro-LEDs (µLEDs). Micro-display technology based on micro-LEDs is still in the early stages of commercial deployment, but it is expected to slowly replace the existing display technologies, such as liquid crystal display on silicon (LCDoS) or organic light emitting diode on silicon (OLEDoS) displays, for certain applications. One of the biggest hurdles for commercializing micro-LED displays is the transfer technology by which the pixelized LEDs are attached to the backplane.

Embodiments described herein describe CMOS driver electronics for the individual control of pixel brightness of microLEDs. The CMOS power plane layout of one or more embodiments uses small interleaving contact areas, alternating $V_{led}$ and $V_{cat}$ contact areas, on at least two long sides of the microLED display area. In the CMOS power plan layout of one or more embodiments, the $V_{led}$ and the cathode current are advantageously injected uniformly along the four sides of the panel. Additionally, a large ring on $V_{led}$ and $V_{cat}$ circuits is used to distribute the current along the four sides of the panel.

Complementary metal-oxide-semiconductor (CMOS), also known as complementary-symmetry metal-oxide-semiconductor (COS-MOS), is a type of metal-oxide-semiconductor field-effect transistor (MOSFET) fabrication process that uses complementary and symmetrical pairs of p-type and n-type MOSFETs for logic functions. CMOS technology is used for constructing integrated circuit (IC) chips. CMOS refers to both a particular style of digital circuitry design and the family of processes used to implement that circuitry on integrated circuits (chips). CMOS circuitry dissipates less power than logic families with resistive loads.

CMOS power circuit layouts have two functions: apply positive $V_{LED}$ potential to each CMOS driver cell and apply ground potential to the pixel common cathode. For these purposes, two different circuits are needed: (1) $V_{cat}$ circuit: to connect electrically CMOS ground contact to common cathode grid of the LED pixels, and (2) $V_{LED}$ potential circuit: to apply positive electrical potential ($V_{LED}$) to each CMOS driver cell.

The CMOS layout may typically be divided into layers designated to digital circuits, small signal analog circuits, and the power train. The latter is preferentially reduced to one or two layers, in particular, the top or bottom most layer, to facilitate current distribution and interconnection to external components, e.g., LED die. Regarding the latter, a peripherical ring around the die is usually used to connect the pixel common cathode grid to the $V_{cat}$ circuit. In one or more embodiments, the ring connection is as close as possible to the die area to reduce Ohmic loss. Interconnection between the common cathode and the ground circuit cannot be situated in the die area as the minimum area needed to interconnect two layers may not fit the current limited space between pixels. Interconnection of the common cathode grid with the power plane is done with µbumps having similar size as the pixel size (~40×40 µm). As current flowing through the entire device is very high and as the length of the first µbump row is limited, current density in the µbump is very high, increasing the risk of reliability failure of metal interconnection. Therefore, limiting current density in µbump is a critical design requirement.

Moreover, thickness of CMOS power plane layers is limited by process constraints. For example, with sputtering or plating, process thickness of CMOS power line is limited to few micrometers. As a result, sheet resistance of the spreading layer will be limited, and electrical loss in spreading layers will be significant. To solve this issue, additional current distribution layers connected in parallel by through vias are generally used.

Traditionally, CMOS power plane layouts use a part of the CMOS backplane for $V_{led}$ potential and use another part of the backplane for $V_{cat}$ potential. In traditional CMOS power plane layouts, a u-shaped cathode electrical circuit (with electrical potential $V_{cat}$) surrounds an $V_{led}$ electrical circuit and is in contact with the µbumps. The u-shaped cathode electrical circuit serves as a current distribution area of the cathode circuit. The issue with this configuration is that cathode current is injected on three panel sides. Current in second current distribution layer is forced to flow to the lateral edges. Since it is not wide enough, resistance is high. This is the main problem leading to non-uniform current distribution through the common cathode µbumps. With this kind of CMOS layout, current is not injected uniformly along the four sides of the die area. As a result, one or more current distribution layers connected in parallel are needed to distribute the cathode current uniformly on the four sides of the LED pixel area and to reduce µ-bump current density.

Additional layers connected in parallel, therefore, are needed to redistribute the current along the remaining side of the die area. The additional layers are, thus, used mostly to distribute current rather than reducing Ohmic losses. As for $V_{LED}$, current is injected only on one side of the panel, causing significant drop voltage between the top and the bottom side of the die area. As a result, current distribution in the die area is not uniform and current density in the µbump is very high.

Figure 1B:
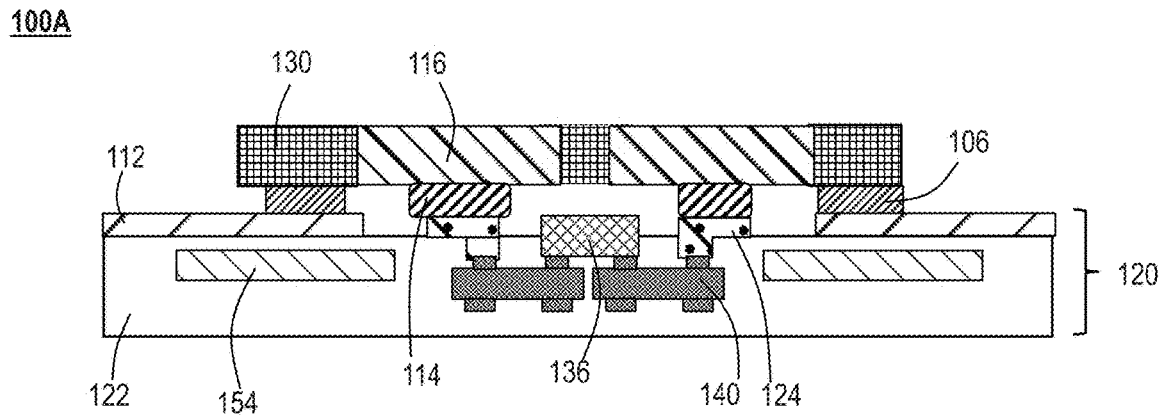
FIG. 1B is a cross-section view taken along line A of FIG. 1A according to one or more embodiments.
Figure 1C:
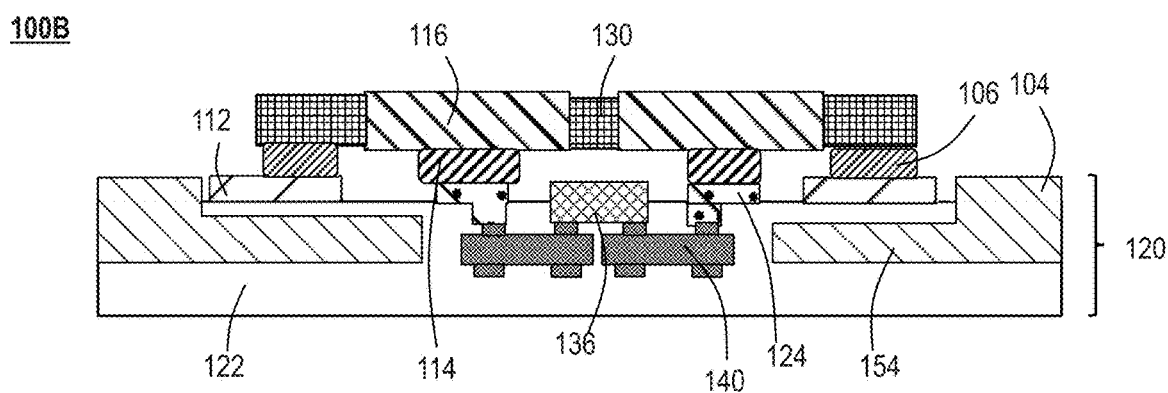
FIG. 1C is a cross-section view take along line B of FIG. 1A according to one or more embodiments.

Accordingly, referring to FIGS. 1A-1C, one or more embodiments provide a CMOS power plane layout 100 where small interleaving cathode distribution areas, alternating $V_{cat}$ and $V_{led}$ contact areas 102, 104, and a large cathode redistribution ring 112 for current distribution around the four sides of the die area are used. With this layout, the current is distributed uniformly over the four sides of the die area and additional current distribution layers connected in parallel can be used mostly to reduce Ohmic losses. As a result, Ohmic power losses and current densities in µbumps are significantly reduced. Moreover, only one type of cathode microBump (uBump or µBump) 106 are needed, simplifying the CMOS panel manufacturing process.

One of skill in the art understands that, for ease of illustration, the plurality of µBumps 106 are not drawn to scale and that the illustrated µBumps 106 are represented larger than they are. Additionally, one of skill in the art understand that several rows of µBumps 106 may be used for the common cathode interconnection with CMOS (not illustrated in the drawings). In practice, the minimum size of µbump is limited by process constraints. In the hybrid CMOS µLED display of one or more embodiments, the diameter of the anode µbump is less than the pixel size and the cathode µbump 106 has the same or similar size as the anode µbump 114.

Figure 1D:
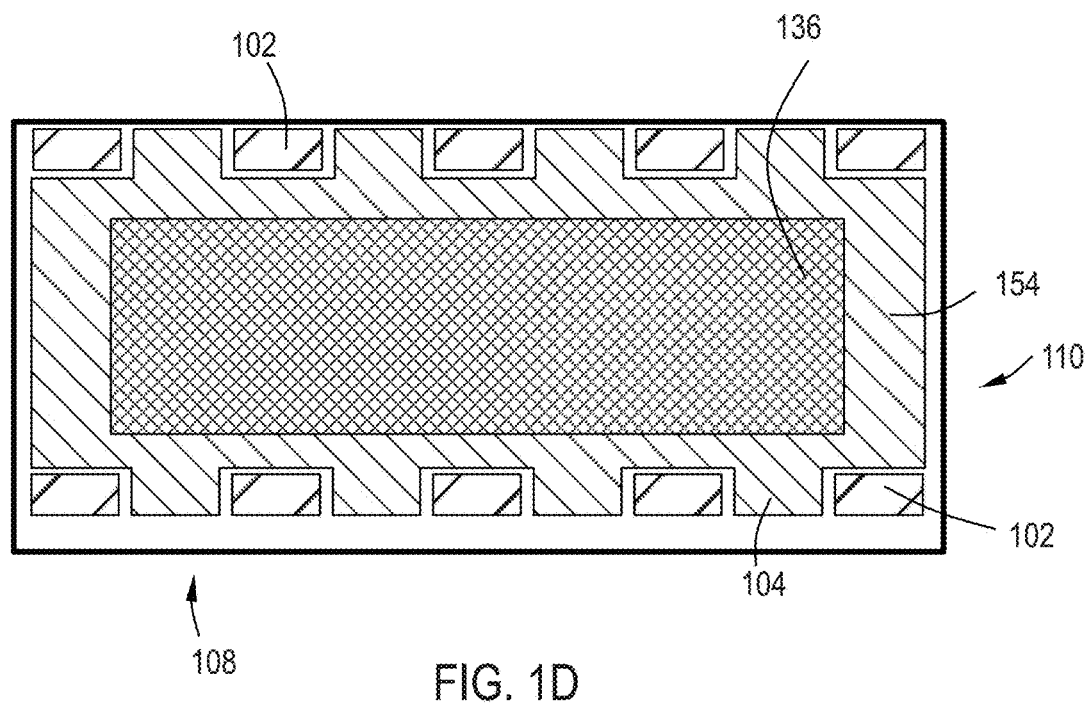
FIG. 1D illustrates a top view of the CMOS second current distribution layer of the CMOS power plane of FIG. 1A according to one or more embodiments.
Figure 1E:
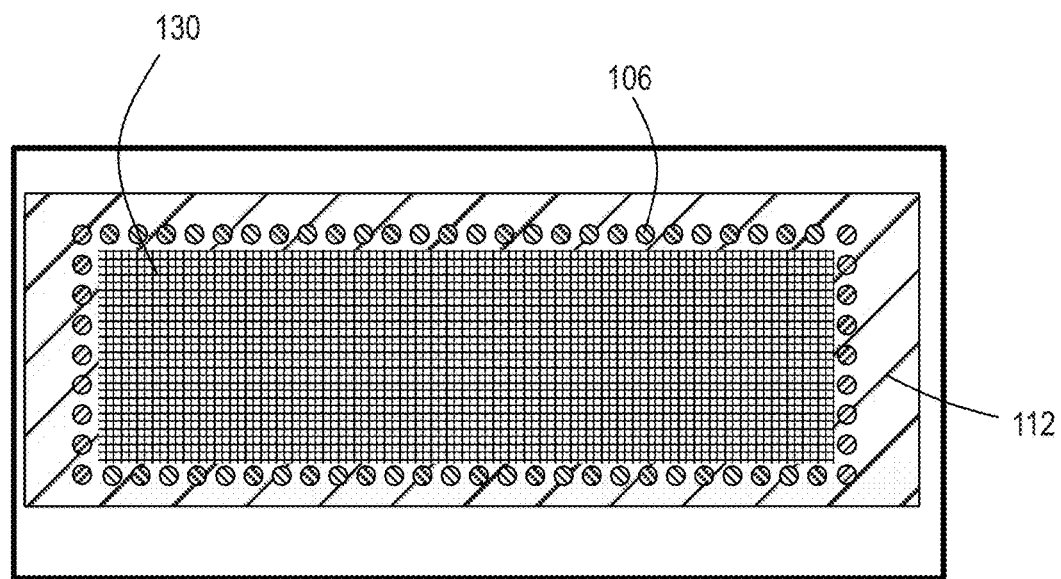
FIG. 1E illustrates a top view of the common cathode of the CMOS power plane of FIG. 1A according to one or more embodiments.

An overview of the CMOS power plane 100 with interleaving areas 102, 104 and a cathode redistribution ring 112 according to the invention is shown in FIGS. 1A-1E. FIGS. 1B and 1C are cross-section views 100A and 100B taken along lines A and B, respectively, of the µLED display area 100 illustrated in FIG. 1A. FIG. 1A is a top view 100 of the CMOS top layer. FIG. 1D is a view 150 of the CMOS second current distribution layer. FIG. 1E is a view 155 of the common cathode.

Referring to FIGS. 1A thru 1C, in one or more embodiments, the CMOS power plane 120 uses small interleaving contact areas, alternating $V_{led}$ 104 contact areas and $V_{cat}$ 102 contact areas, on at least two long sides 108 of the µLED display area 100. As used herein, "interleaving" refers to the interspersing and alternating of $V_{led}$ 104 and cathode 102 contact regions such that an $V_{led}$ 104 contact region is adjacent two cathode 102 contact regions. By this way, $V_{led}$ 104 and cathode 102 current are injected uniformly along the four sides 108, 110 of the panel.

In one or more embodiments, a large cathode redistribution ring 112 on $V_{cat}$ circuit and a common supply voltage $V_{led}$ 154 on $V_{LED}$ circuit are used to distribute the current along the four sides 108, 110 of the panel. It is noted that the cathode redistribution ring 112 of one or more embodiments is a full ring and is not u-shaped ring. As illustrated, only the top and bottom sides of the display 100 are used for current injection. In one or more embodiments, the cathode redistribution ring 112 surrounds a pixel die area, common cathode grid 130. It is noted that, for ease of drawing, the common cathode grid 130 in FIG. 1A has been drawn such that no grid is covering the cathode µbumps 106 so that the cathode µbumps 106 can be seen. One of skill in the art will understand that the common cathode grid 130 may extend over the cathode µbumps 106, as illustrated in FIGS. 1B and 1C.

The pixel die area, common cathode grid 130 comprises a plurality of pixels 116, as illustrated in FIGS. 1B and 1C. While only two pixels 116 are illustrated, one skilled in the art understands that any number of pixels can be present depending upon the size of the pixel 116 and the size of the die. In some embodiments, there may be 86 pixels. In other embodiments, there may be 170 pixels or more. The pixels 116 may have any suitable size known to the skilled artisan. In some embodiments, the pixels 116 may be 40 µm pixels, or 30 µm pixels, or 20 µm pixels.

In one or more embodiments, the interleaving areas are made of at least three contact areas, alternating $V_{cat}$ 102 contact areas and $V_{led}$ 104 contact areas. In the embodiment illustrated in FIG. 1A, interleaving areas are made of ten cathode contact 102 and eight $V_{led}$ contact 104 areas distributed periodically along the two long sides 108 of the CMOS panel 100. In one or more embodiments, the higher the number of alternating $V_{led}$ 104 and cathode 102 contact areas, the better the current distribution will be. Accordingly, in one or more embodiments, more than three, or more than five contact areas are used. In some embodiments, there are at least ten cathode 102 contact regions and at least eight $V_{led}$ 104 contact regions.

In one or more embodiments, the alternating $V_{led}$ 104 and cathode 102 contact regions are positioned on the two long sides 108 of the CMOS panel 100 and not on the two short sides 110 of the panel 100.

With reference to FIGS. 1B and 1C, an architecture with a common cathode grid 130 and CMOS panel 120 bumped (µbump 114) to the p- or anode contact 124 of each pixel 116 is used. One advantage of this configuration is that the CMOS layout is symmetric and the path length between die area and the cathode contacts is the same, providing a good current injection uniformity. In one or more embodiments, driver circuitry 140 is used to control current provided individually to each pixel.

In one or more embodiments, the interleaving area length can vary between a few hundreds of micrometers and several millimeters. In one or more embodiments, the interleaving area may be symmetric. In other embodiments, the interleaving area may be asymmetric. Each interleaving area, with different polarity, is electrically isolated by an area of a few microns in width. In one or more embodiments, the top CMOS current distribution layer for the $V_{cat}$ path is used, as it simplifies the interconnection with common cathode contact. In some embodiments, a second current distribution layer (or more current distribution layers) are used for the $V_{led}$ path. The $V_{led}$ current will pass through electrical vias situated on the contact areas to reach the second current distribution layer connected to the p-contact 124 of each driver cell. In one or more embodiments, the large cathode redistribution ring 112 surrounding the four sides of the die area is used to distribute the current uniformly around the die.

Referring to FIG. 1D, a top view of the CMOS second current distribution layer 150 is illustrated. In one or more embodiments, the common supply voltage $V_{led}$ 154 surrounds the perimeter of the $V_{led}$ grid 136 and includes $V_{led}$ 104 contact areas. The common supply voltage $V_{led}$ 154 has interleaving cathode current distribution areas 102. In one or more embodiments, the cathode current will not travel through the cathode current distribution area 102. Thus, in some unillustrated embodiments, the cathode current distribution area 102 may not be present, thus enlarging the common supply voltage $V_{led}$ 154.

FIG. 1E illustrates the common cathode 155 according to one or more embodiments. The outer area of the cathode redistribution ring 112 overlaps the cathode µbump 106. The cathode redistribution ring 112 surrounds the common cathode grid 130. The common cathode grid 130 contacts each pixel 116 on the pixel side.

In one or more unillustrated embodiments, as an alternative, an inverted architecture with a common anode (instead of a common cathode) and CMOS panel bumped to the n-contact of each pixel could also be used. In this case, a NMOS transistor will be used instead of a PMOS transistor in the driver 140.

Figure 2A:
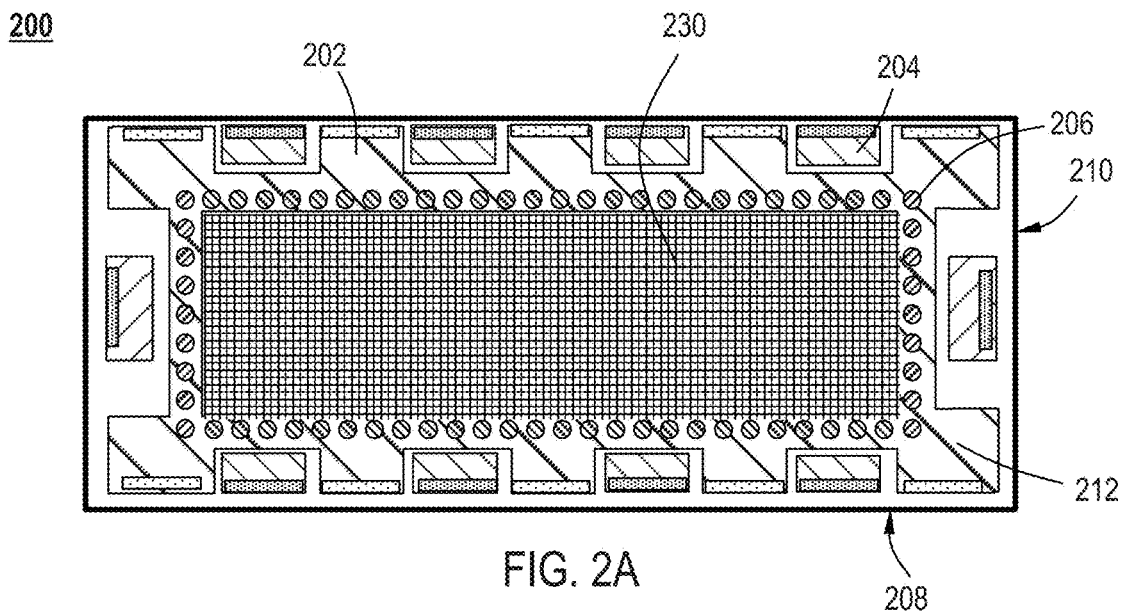
FIG. 2A illustrates a top view the CMOS top layer of a CMOS power plane according to one or more embodiments.
Figure 2B:
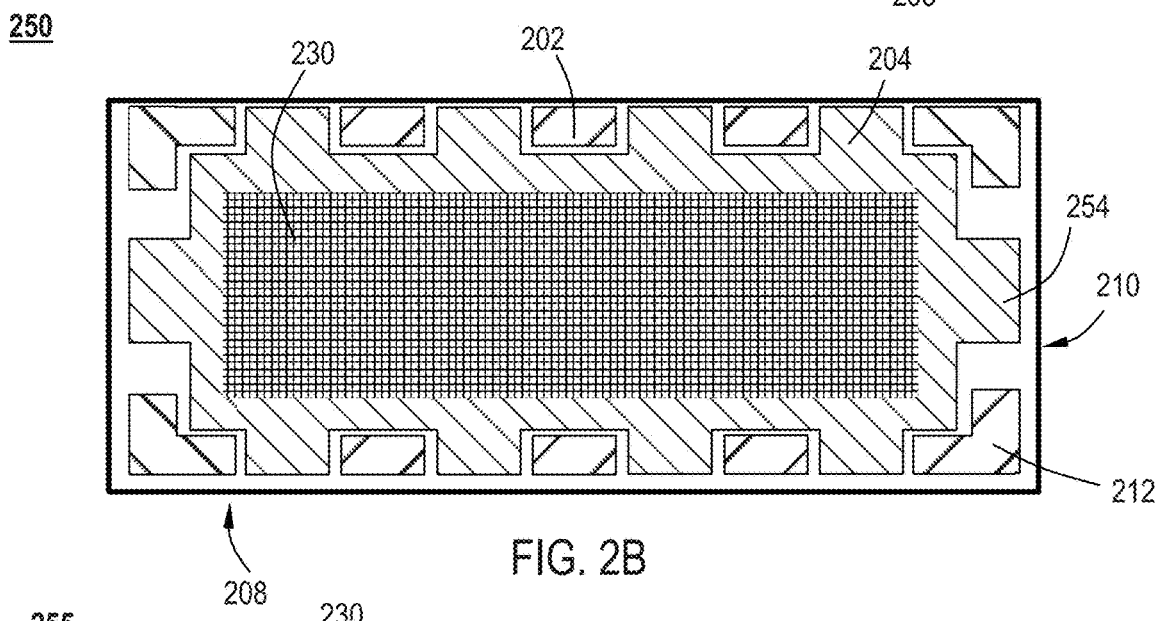
FIG. 2B illustrates a top view of the CMOS second current distribution layer of the CMOS power plane of FIG. 2A according to one or more embodiments.
Figure 2C:
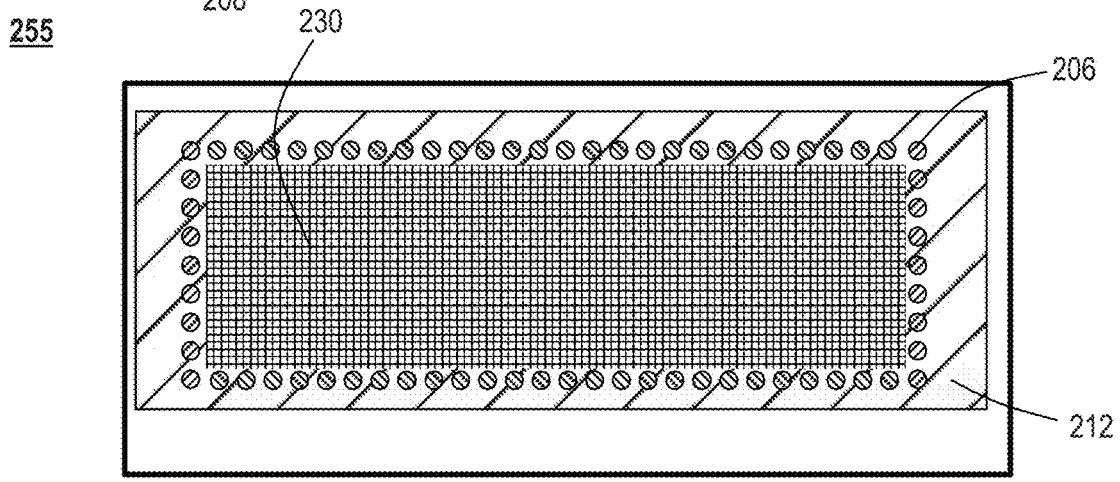
FIG. 2C illustrates a top view of the common cathode of the CMOS power plane of FIG. 2A according to one or more embodiments.

FIGS. 2A-2C illustrate an alternative embodiment, where a CMOS power plane layout 200 has small interleaving cathode distribution areas 202, 204, alternating $V_{cat}$ and $V_{led}$ contact areas 202, 204, and a large cathode redistribution ring 212 for current distribution around the four sides of the die area. With this layout, the current is distributed uniformly over the four sides of the die area and additional current distribution layers connected in parallel can be used mostly to reduce Ohmic losses. As a result, Ohmic power losses and current densities in µbumps are significantly reduced. Moreover, only one type of cathode microBump (uBump or µBump) 206 are needed, simplifying the CMOS panel manufacturing process.

FIG. 2A is a view 200 of the CMOS top layer. FIG. 2B is a view 250 of the CMOS second current distribution layer. FIG. 2C is a view 255 of the common cathode.

Referring to FIG. 2A, all four sides of the panel 200 can be used to place interleaving contact areas. In one or more embodiments, the free space on the short sides 210 of the panel are used to place addressing circuit, driver components, sense, and the like. The interleaving $V_{led}$ contact areas 204 and cathode 202 contact areas are placed around four sides 208, 210 of the panel 200.

In one or more embodiments, a large cathode redistribution ring 212 on $V_{led}$ and $V_{cat}$ circuits is used to distribute the current along the four sides 208, 210 of the panel. It is noted that the cathode redistribution ring 212 of one or more embodiments is a full ring and is not u-shaped ring. As illustrated, only the top and bottom sides of the display 200 are used for current injection. In one or more embodiments, the cathode redistribution ring 212 surrounds a pixel die area, common cathode grid 230. The pixel die area 230 comprises a plurality of pixels (not illustrated).

In one or more embodiments, the interleaving areas are made of at least three contact areas, alternating $V_{cat}$ 202 contact areas and $V_{led}$ 204 contact areas. In the embodiment illustrated in FIG. 2A, interleaving areas are made of ten cathode contact 202 and eight $V_{led}$ contact 204 areas distributed periodically along the four sides 208, 210 of the CMOS panel 200. In one or more embodiments, the higher the number of alternating $V_{led}$ 204 and cathode 202 contact areas, the better the current distribution will be. Accordingly, in one or more embodiments, more than three, or more than five contact areas are used. In some embodiments, there are at least ten cathode 202 contact regions and at least eight $V_{led}$ 204 contact regions.

In one or more embodiments, the alternating $V_{led}$ 204 and cathode 202 contact regions are positioned on the long sides 208 of the CMOS panel 200 and along the two short sides 210 of the panel 200.

In one or more embodiments, the interleaving area length can vary between a few hundreds of micrometers and several millimeters. In one or more embodiments, the interleaving area may be symmetric. In other embodiments, the interleaving areas may be asymmetric. Each interleaving area, with different polarity, is electrically isolated by an area of a few microns in width. In one or more embodiments, the top CMOS current distribution layer for the $V_{cat}$ path is used, as it simplifies the interconnection with common cathode contact. In some embodiments, a second current distribution layer (or more current distribution layers) are used for the $V_{led}$ path. The $V_{led}$ current will pass through electrical vias situated on the contact areas to reach the second current distribution layer connected to the p-contact of each driver cell. In one or more embodiments, the large cathode redistribution ring 212 surrounding the four sides of the die area is used to distribute the current uniformly around the die.

Referring to FIG. 2B, the CMOS second current distribution layer 250 is illustrated. In one or more embodiments, the common supply voltage $V_{led}$ 254 surrounds the perimeter of the die area 230 and includes $V_{led}$ 204 contact areas. The common supply voltage $V_{led}$ 254 has interleaving cathode current distribution areas 202. In one or more embodiments, the cathode current will not travel through the cathode current distribution area 202. Thus, in some unillustrated embodiments, the cathode current distribution area 202 may not be present, thus enlarging the common supply voltage $V_{led}$ 254.

FIG. 2C illustrates the common cathode 255 according to one or more embodiments. The outer area of the cathode redistribution ring 212 overlaps the cathode μbump 206. The cathode redistribution ring 212 surrounds the common cathode grid 230. The common cathode grid 230 contacts each pixel on the pixel side.

Traditionally, CMOS power plane $V_{cat}$ layouts have very high current density in the outermost cathode μbump. This may be caused be the outer contact pad that provides current mainly to the outermost corner cathode μBump. High current density and temperature over time can accelerate the failure mechanism of intermetallic connection. If cracks or delamination appear in one cathode μBump, current will not flow through the μBump and maximum current density of the adjacent μbump will, in turn, also increase.

Figure 3A:
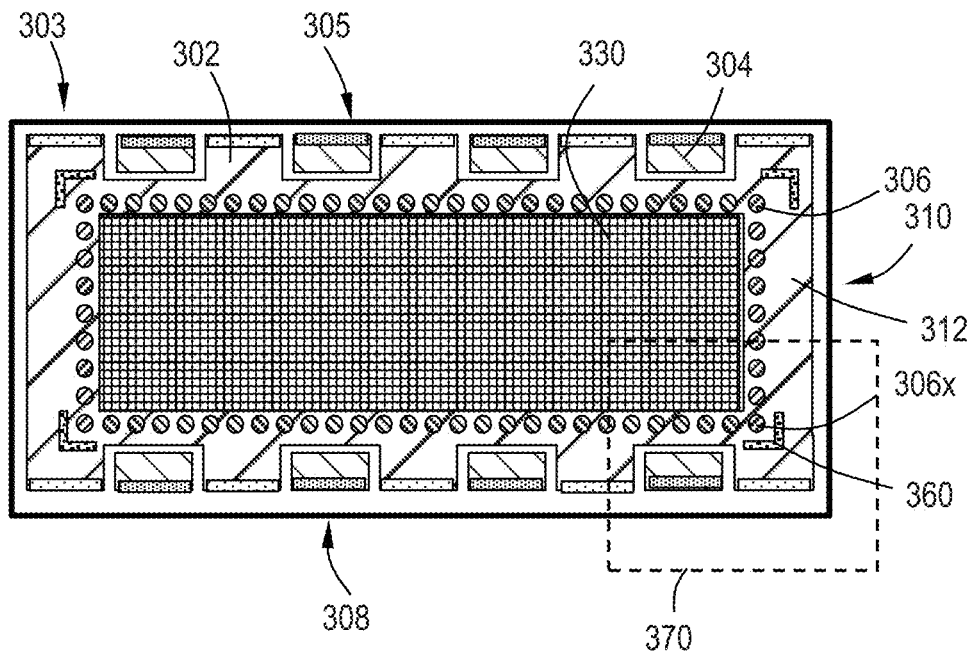
FIG. 3A illustrates a top view of the CMOS top layer having an insulating area of a CMOS power plane according to one or more embodiments.
Figure 3B:
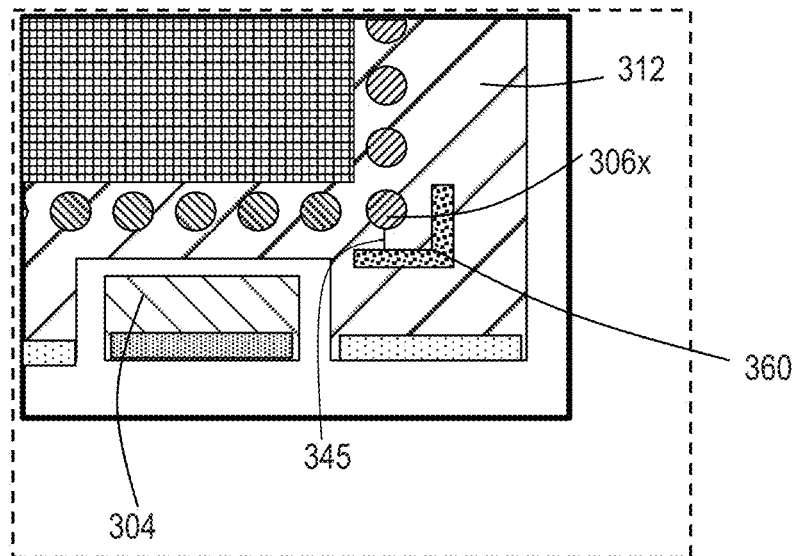
FIG. 3B is an enlarged view of region 370 of the CMOS power plane of FIG. 3A according to one or more embodiments.

Referring to FIGS. 3A and 3B, in one or more embodiments, a solution to reduce the current density in the μBump 306 is to include insulating areas 360 between the outer $V_{cat}$ pads in the common cathode gride 330 and the outermost μbump 306x. FIG. 3B is an enlarged view of area 370 of FIG. 3A.

In one or more embodiments, the direct current flow between the outer $V_{cat}$ pad in the common cathode gride 330 and the corner outermost μbump 306x may then be reduced, and the current density in the cathode μbump 306 may be decreased accordingly. In one or more embodiments, the insulated areas 360 allow reduction in the risk of outermost corner μbump 306x failure due to high current density. The insulated areas 360 will not prevent fully the current to reach the outer most corner μbump 306x. For this purpose, there will be a gap 345 of at least 10 μm between the insulated area 360 and the outermost corner cathode μbump 306x. To reduce current injection on at least two μbumps 306, the length of the insulated area 360 will be at least 80 μm. In one or more embodiments, the insulated areas 360 include two perpendicular etched lines to reduce current injection from both sides.

In some embodiments, the insulated areas 360 comprise etched openings. In other embodiments, the insulated areas 360 comprise a dielectric material. Suitable dielectric materials include, but are not limited to, silicon oxide (SiO), silicon nitride (SiN), silicon carbide (SiC), aluminum oxide (AlOx), aluminum nitride (AlN) and combinations thereof. The skilled artisan will recognize that the use of formulas like SiO, to represent silicon oxide, does not imply any particular stoichiometric relationship between the elements. The formula merely identifies the primary elements of the film.

Visualization systems, such as virtual reality systems and augmented reality systems, are becoming increasingly more common in fields such as entertainment, education, medicine, and business.

In a virtual reality system, a display can present to a user a view of scene, such as a three-dimensional scene. The user can move within the scene, such as by repositioning the user's head or by walking. The virtual reality system can detect the user's movement and alter the view of the scene to account for the movement. For example, as a user rotates the user's head, the system can present views of the scene that vary in view directions to match the user's gaze. In this manner, the virtual reality system can simulate a user's presence in the three-dimensional scene. Further, a virtual reality system can receive tactile sensory input, such as from wearable position sensors, and can optionally provide tactile feedback to the user.

In an augmented reality system, the display can incorporate elements from the user's surroundings into the view of the scene. For example, the augmented reality system can add textual captions and/or visual elements to a view of the user's surroundings. For example, a retailer can use an augmented reality system to show a user what a piece of furniture would look like in a room of the user's home, by incorporating a visualization of the piece of furniture over a captured image of the user's surroundings. As the user moves around the user's room, the visualization accounts for the user's motion and alters the visualization of the furniture in a manner consistent with the motion. For example, the augmented reality system can position a virtual chair in a room. The user can stand in the room on a front side of the virtual chair location to view the front side of the chair. The user can move in the room to an area behind the virtual chair location to view a back side of the chair. In this manner, the augmented reality system can add elements to a dynamic view of the user's surroundings.

Figure 6:
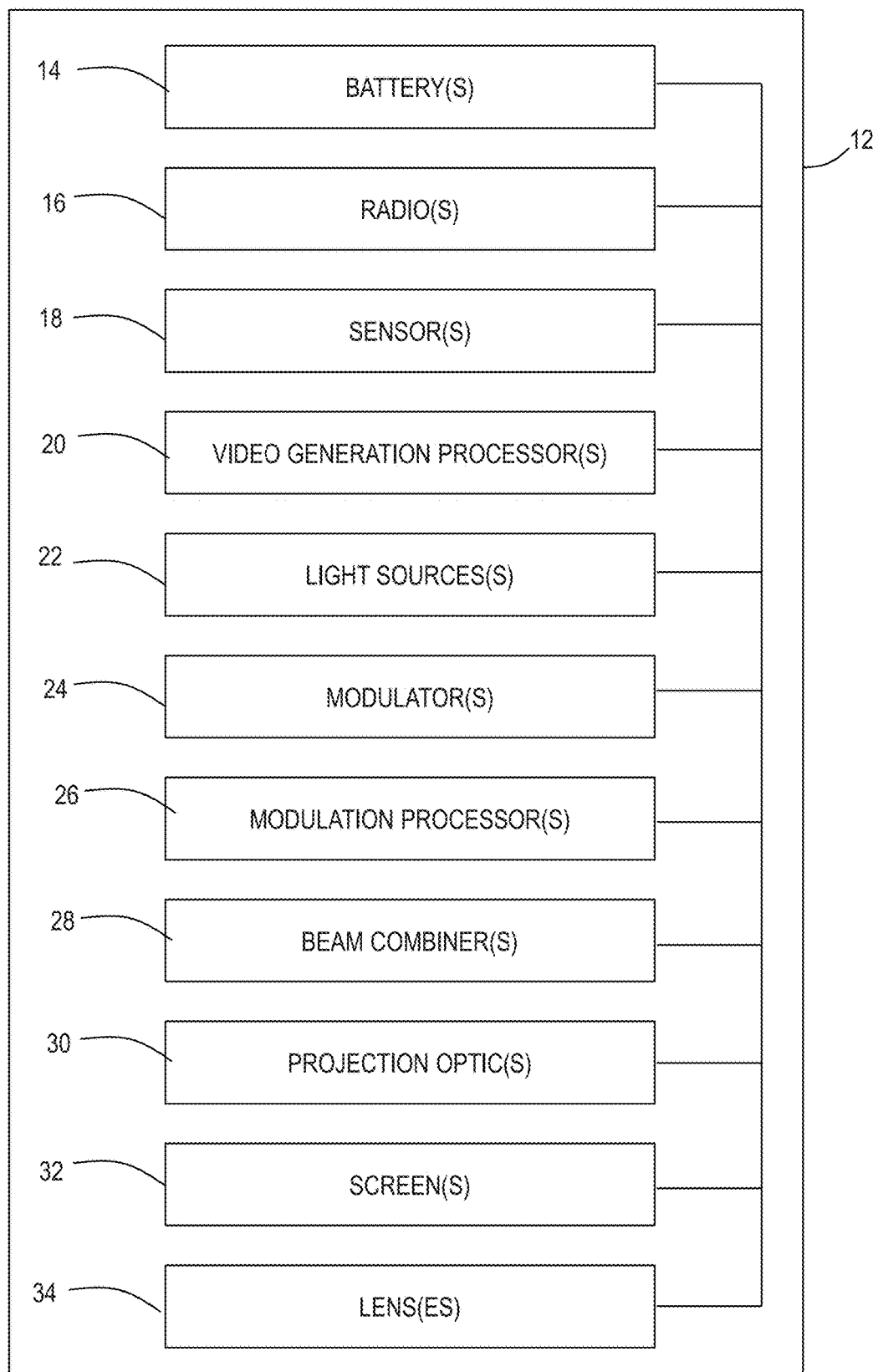
FIG. 6 illustrates a block diagram of an example of a visualization system using the µLED array of one or more embodiments.

FIG. 6 shows a block diagram of an example of a visualization system 10 that utilizes the μLED array of one or more embodiments. The visualization system 10 can include a wearable housing 12, such as a headset or goggles. The housing 12 can mechanically support and house the elements detailed below. In some examples, one or more of the elements detailed below can be included in one or more additional housings that can be separate from the wearable housing 12 and couplable to the wearable housing 12 wirelessly and/or via a wired connection. For example, a separate housing can reduce the weight of wearable goggles, such as by including batteries, radios, and other elements. The housing 12 can include one or more batteries 14, which can electrically power any or all of the elements detailed below. The housing 12 can include circuitry that can electrically couple to an external power supply, such as a wall outlet, to recharge the batteries 14. The housing 12 can include one or more radios 16 to communicate wirelessly with a server or network via a suitable protocol, such as WiFi.

The visualization system 10 can include one or more sensors 18, such as optical sensors, audio sensors, tactile sensors, thermal sensors, gyroscopic sensors, time-of-flight sensors, triangulation-based sensors, and others. In some examples, one or more of the sensors can sense a location, a position, and/or an orientation of a user. In some examples, one or more of the sensors 18 can produce a sensor signal in response to the sensed location, position, and/or orientation. The sensor signal can include sensor data that corresponds to a sensed location, position, and/or orientation. For example, the sensor data can include a depth map of the surroundings. In some examples, such as for an augmented reality system, one or more of the sensors 18 can capture a real-time video image of the surroundings proximate a user.

The visualization system 10 can include one or more video generation processors 20. The one or more video generation processors 20 can receive from a server and/or a storage medium, scene data that represents a three-dimensional scene, such as a set of position coordinates for objects in the scene or a depth map of the scene. The one or more video generation processors 20 can receive one or more sensor signals from the one or more sensors 18. In response to the scene data, which represents the surroundings, and at least one sensor signal, which represents the location and/or orientation of the user with respect to the surroundings, the one or more video generation processors 20 can generate at least one video signal that corresponds to a view of the scene. In some examples, the one or more video generation processors 20 can generate two video signals, one for each eye of the user, that represent a view of the scene from a point of view of the left eye and the right eye of the user, respectively. In some examples, the one or more video generation processors 20 can generate more than two video signals and combine the video signals to provide one video signal for both eyes, two video signals for the two eyes, or other combinations.

The visualization system 10 can include one or more light sources 22 that can provide light for a display of the visualization system 10. Suitable light sources 22 can include a light-emitting diode, a monolithic light-emitting diode, a plurality of light-emitting diodes, an array of light-emitting diodes, an array of light-emitting diodes disposed on a common substrate, a segmented light-emitting diode that is disposed on a single substrate and has light-emitting diode elements that are individually addressable and controllable (and/or controllable in groups and/or subsets), an array of micro-light-emitting diodes (microLEDs), and others.

A light-emitting diode can be a white-light light-emitting diode. For example, a white-light light-emitting diode can emit excitation light, such as blue light or violet light. The white-light light-emitting diode can include one or more phosphors that can absorb some or all of the excitation light and can, in response, emit phosphor light, such as yellow light, which has a wavelength greater than a wavelength of the excitation light.

The one or more light sources 22 can include light-producing elements having different colors or wavelengths. For example, a light source can include a red light-emitting diode that can emit red light, a green light-emitting diode that can emit green light, and a blue light-emitting diode that can emit blue right. The red, green, and blue light combine in specified ratios to produce any suitable color that is visually perceptible in a visible portion of the electromagnetic spectrum.

The visualization system 10 can include one or more modulators 24. The modulators 24 can be implemented in one of at least two configurations.

In a first configuration, the modulators 24 can include circuitry that can modulate the light sources 22 directly. For example, the light sources 22 can include an array of light-emitting diodes, and the modulators 24 can directly modulate the electrical power, electrical voltage, and/or electrical current directed to each light-emitting diode in the array to form modulated light. The modulation can be performed in an analog manner and/or a digital manner. In some examples, the light sources 22 can include an array of red light-emitting diodes, an array of green light-emitting diodes, and an array of blue light-emitting diodes, and the modulators 24 can directly modulate the red light-emitting diodes, the green light-emitting diodes, and the blue light-emitting diodes to form the modulated light to produce a specified image.

In a second configuration, the modulators 24 can include a modulation panel, such as a liquid crystal panel. The light sources 22 can produce uniform illumination, or nearly uniform illumination, to illuminate the modulation panel. The modulation panel can include pixels. Each pixel can selectively attenuate a respective portion of the modulation panel area in response to an electrical modulation signal to form the modulated light. In some examples, the modulators 24 can include multiple modulation panels that can modulate different colors of light. For example, the modulators 24 can include a red modulation panel that can attenuate red light from a red-light source such as a red light-emitting diode, a green modulation panel that can attenuate green light from a green light source such as a green light-emitting diode, and a blue modulation panel that can attenuate blue light from a blue light source such as a blue light-emitting diode.

In some examples of the second configuration, the modulators 24 can receive uniform white light or nearly uniform white light from a white light source, such as a white-light light-emitting diode. The modulation panel can include wavelength-selective filters on each pixel of the modulation panel. The panel pixels can be arranged in groups (such as groups of three or four), where each group can form a pixel of a color image. For example, each group can include a panel pixel with a red color filter, a panel pixel with a green color filter, and a panel pixel with a blue color filter. Other suitable configurations can also be used.

The visualization system 10 can include one or more modulation processors 26, which can receive a video signal, such as from the one or more video generation processors 20, and, in response, can produce an electrical modulation signal. For configurations in which the modulators 24 directly modulate the light sources 22, the electrical modulation signal can drive the light sources 24. For configurations in which the modulators 24 include a modulation panel, the electrical modulation signal can drive the modulation panel.

The visualization system 10 can include one or more beam combiners 28 (also known as beam splitters 28), which can combine light beams of different colors to form a single multi-color beam. For configurations in which the light sources 22 can include multiple light-emitting diodes of different colors, the visualization system 10 can include one or more wavelength-sensitive (e.g., dichroic) beam splitters 28 that can combine the light of different colors to form a single multi-color beam.

The visualization system 10 can direct the modulated light toward the eyes of the viewer in one of at least two configurations. In a first configuration, the visualization system 10 can function as a projector, and can include suitable projection optics 30 that can project the modulated light onto one or more screens 32. The screens 32 can be located a suitable distance from an eye of the user. The visualization system 10 can optionally include one or more lenses 34 that can locate a virtual image of a screen 32 at a suitable distance from the eye, such as a close-focus distance, such as 500 mm, 750 mm, or another suitable distance. In some examples, the visualization system 10 can include a single screen 32, such that the modulated light can be directed toward both eyes of the user. In some examples, the visualization system 10 can include two screens 32, such that the modulated light from each screen 32 can be directed toward a respective eye of the user. In some examples, the visualization system 10 can include more than two screens 32. In a second configuration, the visualization system 10 can direct the modulated light directly into one or both eyes of a viewer. For example, the projection optics 30 can form an image on a retina of an eye of the user, or an image on each retina of the two eyes of the user.

For some configurations of augmented reality systems, the visualization system 10 can include an at least partially transparent display, such that a user can view the user's surroundings through the display. For such configurations, the augmented reality system can produce modulated light that corresponds to the augmentation of the surroundings, rather than the surroundings itself. For example, in the example of a retailer showing a chair, the augmented reality system can direct modulated light, corresponding to the chair but not the rest of the room, toward a screen or toward an eye of a user.

The disclosure is now described with reference to the following examples. Before describing several exemplary embodiments of the disclosure, it is to be understood that the disclosure is not limited to the details of construction or process steps set forth in the following description. The disclosure is capable of other embodiments and of being practiced or being carried out in various ways.

EXAMPLES

Comparative Example 1

Figure 4A:
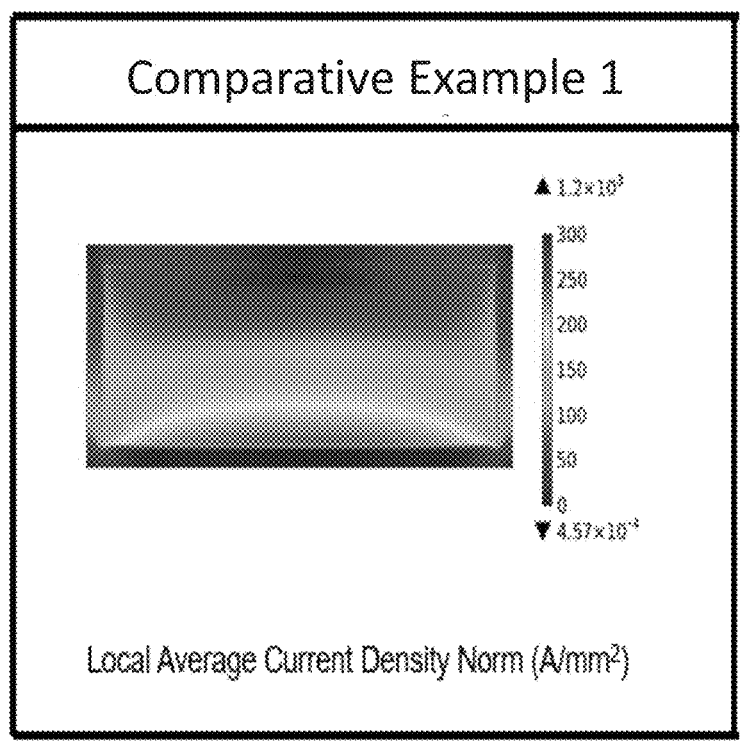
FIG. 4A is a current density plot of a CMOS power plane according to one or more embodiments.

A CMOS layout having two current distribution layers was formed. The CMOS layout has a u-shaped cathode ring. The current density for the CMOS layout was computed. As illustrated in FIG. 4A, the current density is not uniform.

Example 2

Figure 4B:
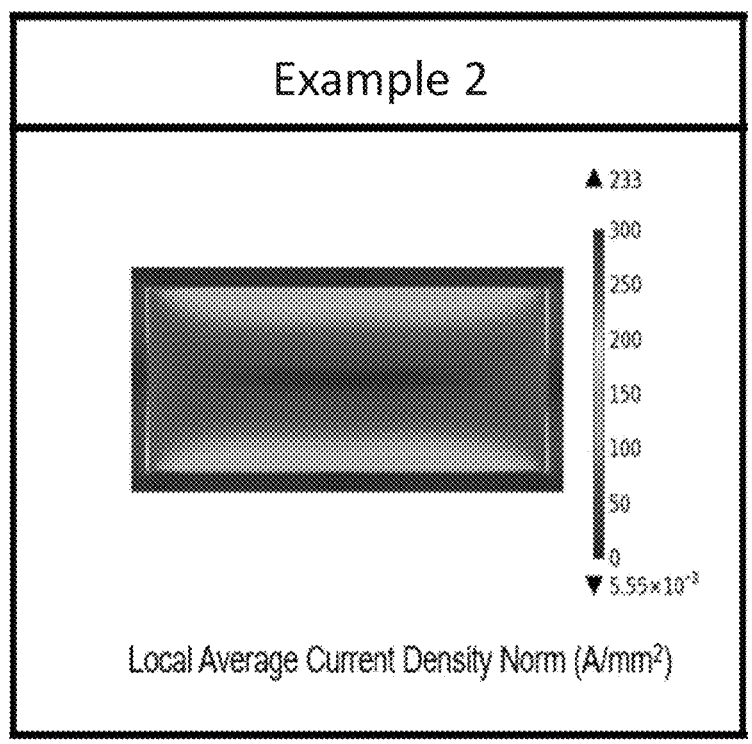
FIG. 4B is a current density plot of a CMOS power plane according to one or more embodiments.

A CMOS layout having eight interleaving current distribution areas was formed. The current density for the CMOS layout having eight interleaving current distribution areas was computed. As illustrated in FIG. 4B, the current density was uniform.

Table 1 shows a comparison of power losses between the comparative Example 1 CMOS layout with two current distribution layers and the Example 2 CMOS layout with interleaving areas on bottom and top panel sides and with continuous current distribution ring. Ohmic losses are reduced by more than 40% in the power plane layout of one or more embodiments. The average current density passing through the cathode μbumps is also much lower.

TABLE 1

Comparison of Power Loss

| Design | $V_{CAT}$ loss (W) | $V_{LED}$ loss (W) | Common Cathode Loss (W) | Total loss (W) | μBumps Avg J (A/mm$^2$) |
|---|---|---|---|---|---|
| Comparative Example 1 | 0.58 | 1.98 | 0.65 | 3.22 | 261.5 |
| Example 2 | 0.52 | 1.05 | 0.21 | 1.78 | 138.2 |

Example 3

A CMOS layout having eight interleaving current distribution areas was formed. The layout had no insulating areas between the outer $V_{cat}$ pads and the outermost μbump vias. The current density was measured and is shown in FIG. 7A.

Example 4

Figure 5A:
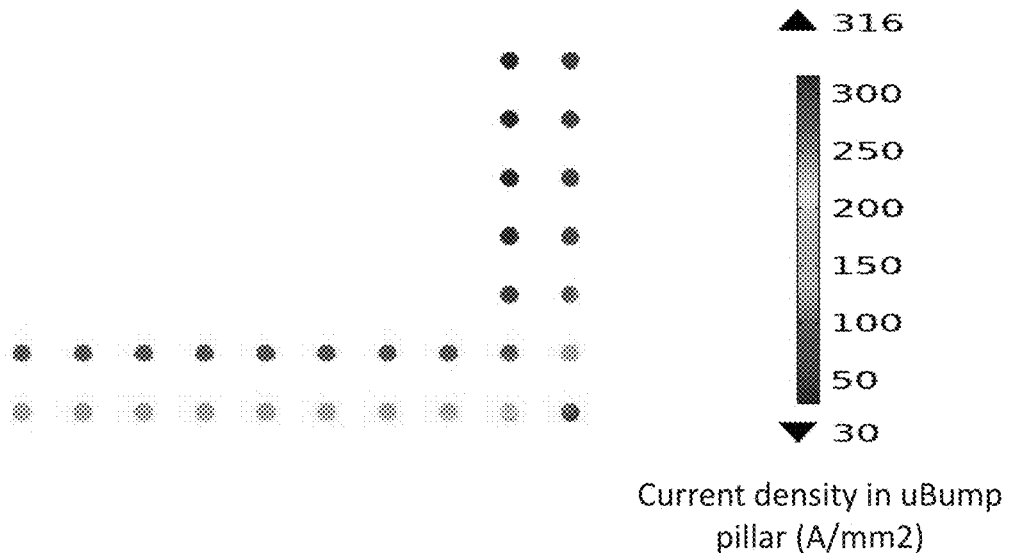
FIG. 5A is a current density plot of a µBump according to one or more embodiments.
Figure 5B:
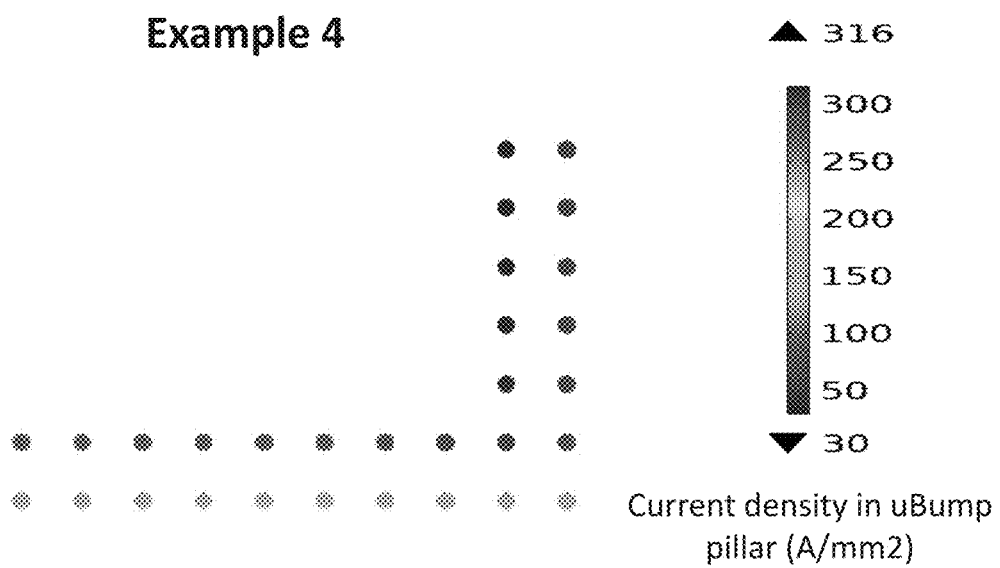
FIG. 5B is a current density plot of a µBump according to one or more embodiments.

A CMOS layout having eight interleaving current distribution areas was formed. The layout had insulating areas between the outer $V_{cat}$ pads and the outermost μbump vias. The current density was measured. FIGS. 5A and 5B compare current density in the cathode μBump between layout with (Example 4) and without (Example 3) insulated area between the outer $V_{cat}$ contact area and the outermost corner μbump. The current density in the outermost corner cathode μBump of the layout with insulated area is reduced by more than 30%.

EMBODIMENTS

Various embodiments are listed below. It will be understood that the embodiments listed below may be combined with all aspects and other embodiments in accordance with the scope of the invention.

Embodiment (a). A CMOS power plane comprising: a cathode redistribution ring having an inner portion and an outer portion, the inner portion surrounding a perimeter of a die pixel area, the outer portion comprising a common supply voltage $V_{led}$ interleaved with a cathode current distribution area; and a plurality of cathode μbumps contacting the inner portion of the cathode redistribution ring along the perimeter of the die pixel area.

Embodiment (b). The CMOS power plane of embodiment (a), wherein the common supply voltage $V_{led}$ and the cathode current distribution area are interleaved on two sides of the die pixel area.

Embodiment (c). The CMOS power plane of embodiment (a) to (b), wherein the common supply voltage $V_{led}$ and the cathode current distribution area are interleaved on four sides of the die pixel area.

Embodiment (d). The CMOS power plane of embodiment (a) to (c), wherein there are at least three common supply voltage $V_{led}$ interleaved with at least three cathode current distribution areas.

Embodiment (e). The CMOS power plane of embodiment (a) to (d), further comprising an insulated area on the cathode redistribution ring adjacent one of the plurality of cathode μbumps.

Embodiment (f). The CMOS power plane of embodiment (a) to (e), wherein the insulated area comprises etched lines.

Embodiment (g). The CMOS power plane of embodiment (a) to (f), wherein the insulated area comprises a dielectric material.

Embodiment (h). The CMOS power plane of embodiment (a) to (g), further comprising a plurality of PMOS transistors connected to the die pixel area.

Embodiment (i). The CMOS power plane of embodiment (a) to (h), wherein the plurality of cathode μbumps are electrically connected to a common cathode grid.

Embodiment (j). The CMOS power plane of embodiment (a) to (i), wherein the die pixel area comprises a plurality of pixels.

Embodiment (k). The CMOS power plane of embodiment (a) to (j), wherein the insulated area has a size of greater than 80 μm.

Embodiment (l). A CMOS layout comprising: a power plane on a substrate, the power plane having a plurality of alternating $V_{led}$ contact areas and cathode contact areas uniformly dispersed along at least two sides of the power plane; a cathode current redistribution ring extending along four sides of the power plane; a plurality of cathode µbumps connecting each of the plurality of alternating $V_{led}$ contact areas and cathode contact areas to a corresponding p contact of a plurality of pixels; and a common cathode grid electrically connecting the plurality of pixels and the plurality of cathode µbumps.

Embodiment (m). The CMOS layout of embodiment (1), wherein the $V_{led}$ contact area and the cathode contact area are interleaved on two sides.

Embodiment (n). The CMOS layout of embodiment (1) to (m), wherein the $V_{led}$ contact area and the cathode contact area are interleaved on four sides.

Embodiment (o). The CMOS layout of embodiment (1) to (n), wherein there are at least three $V_{led}$ contact areas alternating with at least three cathode contact areas.

Embodiment (p). The CMOS layout of embodiment (1) to (o), further comprising an insulated area on the cathode current redistribution ring adjacent one of the plurality of cathode µbumps.

Embodiment (q). The CMOS layout of embodiment (1) to (p), wherein the insulated area comprises etched lines.

Embodiment (r). The CMOS layout of embodiment (1) to (q), wherein the insulated area comprises a dielectric material.

Embodiment (s). The CMOS layout of embodiment (1) to (r), further comprising a plurality of PMOS transistors connected in parallel to at least one of a plurality of pixels.

Embodiment (t). The CMOS layout of embodiment (1) to (s), wherein the insulated area has a size of greater than 80 µm.

Embodiment (u). A CMOS power plane comprising: a cathode redistribution ring having an inner portion and an outer portion, the inner portion surrounding a perimeter of a die pixel area, the outer portion comprising area common supply voltage $V_{led}$ interleaved with a cathode current distribution area along a first side, a second side, a third side, and a fourth side of the CMOS power plane; and a plurality of cathode µbumps contacting the inner portion of the cathode redistribution ring along the perimeter of the die pixel area.

Embodiment (v). The CMOS power plane of embodiment (u), wherein there are at least three common supply voltage $V_{led}$ areas interleaved with at least three cathode current distribution areas.

Embodiment (w). The CMOS power plane of embodiment (u) to (v), further comprising an insulated area on the cathode redistribution ring adjacent one of the plurality of cathode µbumps.

Embodiment (x). The CMOS power plane of embodiment (u) to (w), wherein the insulated area comprises etched lines.

Embodiment (y). The CMOS power plane of embodiment (u) to (x), wherein the insulated area comprises a dielectric material.

Embodiment (z). The CMOS power plane of embodiment (u) to (y), further comprising a plurality of PMOS transistors connected to the die pixel area.

Embodiment (aa). The CMOS power plane of embodiment (u) to (z), wherein the plurality of cathode µbumps are electrically connected to a common cathode grid.

Embodiment (bb). The CMOS power plane of claim embodiment (u) to (aa), wherein the die pixel area comprises a plurality of pixels.

Embodiment (cc). The CMOS power plane of embodiment (u) to (bb), wherein the insulated area has a size of greater than 80 µm.

Embodiment (dd). The CMOS power plane of embodiment (u) to (cc), wherein the insulated area is at least 10 µm away from one of the plurality of cathode µbumps.

Embodiment (ee). A CMOS layout comprising: a power plane on a substrate, the power plane having a plurality of alternating $V_{led}$ contact areas and cathode contact areas dispersed along a first side, a second side, a third side, and a fourth side of the power plane; a cathode current redistribution ring extending along the first side, the second side, the third side, and the fourth side of the power plane; a plurality of cathode µbumps connecting each of the plurality of alternating $V_{led}$ contact areas and cathode contact areas to a corresponding p contact of a plurality of pixels; and a common cathode grid electrically connecting the plurality of pixels and the plurality of cathode µbumps.

Embodiment (ff). The CMOS layout of embodiment (ee), wherein there are at least three $V_{led}$ contact areas alternating with at least three cathode contact areas.

Embodiment (gg). The CMOS layout of embodiment (ee) to (ff), further comprising an insulated area on the cathode current redistribution ring adjacent one of the plurality of cathode µbumps.

Embodiment (hh). The CMOS layout of embodiment (ee) to (gg), wherein the insulated area comprises etched lines.

Embodiment (ii). The CMOS layout of embodiment (ee) to (hh), further comprising a plurality of PMOS transistors connected in parallel to at least one of a plurality of pixels.

Embodiment (jj). The CMOS power plane of embodiment (ee) to (ii), wherein the insulated area has a size of greater than 80 µm.

Embodiment (kk). The CMOS layout of embodiment (ee) to (jj), wherein the insulated area is at least 10 µm away from one of the plurality of cathode µbumps.

Embodiment (ll). The CMOS layout of embodiment (ee) to (kk), wherein the insulated area comprises a dielectric material.

Embodiment (mm). The CMOS layout of embodiment (ee) to (ll), wherein the alternating $V_{led}$ contact areas and cathode contact areas are uniformly dispersed along the first side, the second side, the third side, and the fourth side of the power plane.

Embodiment (nn). A CMOS power plane comprising: a cathode redistribution ring having an inner portion and an outer portion, the inner portion surrounding a perimeter of a die pixel area, the outer portion comprising area common supply voltage $V_{led}$ interleaved with a cathode current distribution area; a plurality of cathode µbumps contacting the inner portion of the cathode redistribution ring along the perimeter of the die pixel area; and an insulated area on the cathode redistribution ring adjacent one of the plurality of cathode µbumps.

Embodiment (oo). The CMOS power plane of embodiment (nn), wherein the common supply voltage $V_{led}$ and the cathode current distribution area are interleaved on two sides of the die pixel area.

Embodiment (pp). The CMOS power plane of embodiment (nn) to (oo), wherein the common supply voltage $V_{led}$ and the cathode current distribution area are interleaved on four sides of the die pixel area.

Embodiment (qq). The CMOS power plane of embodiment (nn) to (pp), wherein there are at least three common supply voltage $V_{led}$ interleaved with at least three cathode current distribution areas.

Embodiment (a). The CMOS power plane of embodiment (nn) to (qq), wherein the insulated area comprises etched lines.

Embodiment (ss). The CMOS power plane of embodiment (nn) to (rr), wherein the insulated area comprises a dielectric material.

Embodiment (tt). The CMOS power plane of embodiment (nn) to (ss), wherein the plurality of cathode μbumps are electrically connected to a common cathode grid.

Embodiment (uu). The CMOS power plane of embodiment (nn) to (tt), wherein the die pixel area comprises a plurality of pixels.

Embodiment (vv). The CMOS power plane of embodiment (nn) to (uu), wherein the insulated area has a size of greater than 80 μm.

Embodiment (ww). The CMOS power plane of embodiment (nn) to (vv), wherein the insulated area is at least 10 μm away from one of the plurality of cathode μbumps.

Embodiment (xx). The CMOS power plane of embodiment (nn) to (ww), wherein there are eight common supply voltage $V_{led}$ interleaved with ten cathode current distribution areas.

Embodiment (yy). A CMOS layout comprising: a power plane on a substrate, the power plane having a plurality of alternating $V_{led}$ contact areas and cathode contact areas uniformly dispersed along at least two sides of the power plane; a cathode current redistribution ring extending along four sides of the power plane; a plurality of cathode μbumps connecting each of the plurality of alternating $V_{led}$ contact areas and cathode contact areas to a corresponding p contact of a plurality of pixels; an insulated area on the cathode current redistribution ring adjacent one of the plurality of cathode μbumps; and a common cathode grid electrically connecting the plurality of pixels and the plurality of cathode μbumps.

Embodiment (zz). The CMOS layout of embodiment (yy), wherein the $V_{led}$ contact areas and the cathode contact areas are interleaved on two sides.

Embodiment (aaa). The CMOS layout of embodiment (yy) to (zz), wherein the $V_{led}$ contact areas and the cathode contact areas are interleaved on four sides.

Embodiment (bbb). The CMOS layout of embodiment (yy) to (aaa), wherein there are at least three $V_{led}$ contact areas alternating with at least three cathode contact areas.

Embodiment (ccc). The CMOS layout of embodiment (yy) to (bbb), wherein the insulated area comprises etched lines.

Embodiment (ddd). The CMOS layout of embodiment (yy) to (ccc), wherein the insulated area comprises a dielectric material.

Embodiment (eee). The CMOS layout of embodiment (yy) to (ddd), further comprising a plurality of PMOS transistors connected in parallel to at least one of a plurality of pixels.

Embodiment (fff). The CMOS layout of embodiment (yy) to (eee), wherein the insulated area has a size of greater than 80 μm.

Embodiment (ggg). The CMOS layout of embodiment (yy) to (fff), wherein the insulated area is at least 10 μm away from one of the plurality of cathode μbumps.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to the terms first, second, third, etc. may be used herein to describe various elements, and these elements should not be limited by these terms. These terms may be used to distinguish one element from another.

Reference throughout this specification to a layer, region, or substrate as being "on" or extending "onto" another element, means that it may be directly on or extend directly onto the other element or intervening elements may also be present. When an element is referred to as being "directly on" or extending "directly onto" another element, there may be no intervening elements present. Furthermore, when an element is referred to as being "connected" or "coupled" to another element, it may be directly connected or coupled to the other element and/or connected or coupled to the other element via one or more intervening elements. When an element is referred to as being "directly connected" or "directly coupled" to another element, there are no intervening elements present between the element and the other element. It will be understood that these terms are intended to encompass different orientations of the element in addition to any orientation depicted in the figures.

Relative terms such as "below," "above," "upper,", "lower," "horizontal" or "vertical" may be used herein to describe a relationship of one element, layer, or region to another element, layer, or region as illustrated in the figures. It will be understood that these terms are intended to encompass different orientations of the device in addition to the orientation depicted in the figures.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A CMOS power plane comprising:
   a cathode redistribution ring having an inner portion and an outer portion, the inner portion surrounding a perimeter of a die pixel area, the outer portion comprising an common supply voltage $V_{led}$ interleaved with a cathode current distribution area along a first side, a second side, a third side, and a fourth side of the CMOS power plane; and
   a plurality of cathode µbumps contacting the inner portion of the cathode redistribution ring along the perimeter of the die pixel area.

2. The CMOS power plane of claim 1, wherein there are at least three common supply voltage Vied interleaved with at least three cathode current distribution areas.

3. The CMOS power plane of claim 1, further comprising an insulated area on the cathode redistribution ring adjacent one of the plurality of cathode µbumps, wherein the insulated area comprises etched lines.

4. The CMOS power plane of claim 1, further comprising an insulated area on the cathode redistribution ring adjacent one of the plurality of cathode ubumps, wherein the insulated area comprises a dielectric material.

5. The CMOS power plane of claim 1, further comprising a plurality of PMOS transistors connected to the die pixel area.

6. The CMOS power plane of claim 1, wherein the plurality of cathode ubumps are electrically connected to a common cathode grid.

7. The CMOS power plane of claim 1, wherein the die pixel area comprises a plurality of pixels.

8. The CMOS power plane of claim 1, further comprising an insulated area on the cathode redistribution ring adjacent one of the plurality of cathode µbumps, wherein the insulated area has a size of greater than 80 µm.

9. The CMOS power plane of claim 1, further comprising an insulated area on the cathode redistribution ring adjacent one of the plurality of cathode µbumps, wherein the insulated area is at least 10 µm away from one of the plurality of cathode µbumps.

10. The CMOS power plane of claim 1, wherein there are eight common supply voltage $V_{led}$ interleaved with ten cathode current distribution areas.

11. A CMOS layout comprising:
    a power plane on a substrate, the power plane having a plurality of alternating $V_{led}$ contact areas and cathode contact areas dispersed along a first side, a second side, a third side, and a fourth side of the power plane;
    a cathode current redistribution ring extending along the first side, the second side, the third side, and the fourth side of the power plane;
    a plurality of cathode µbumps connecting each of the plurality of alternating Vled contact areas and cathode contact areas to a corresponding p contact of a plurality of pixels; and
    a common cathode grid electrically connecting the plurality of pixels and the plurality of cathode µbumps.

12. The CMOS layout of claim 11, wherein there are at least three $V_{led}$ contact areas alternating with at least three cathode contact areas.

13. The CMOS layout of claim 11, further comprising an insulated area on the cathode current redistribution ring adjacent one of the plurality of cathode µbumps, wherein the insulated area comprises etched lines.

14. The CMOS layout of claim 11, further comprising a plurality of PMOS transistors connected in parallel to at least one of a plurality of pixels.

15. The CMOS layout of claim 11, further comprising an insulated area on the cathode current redistribution ring adjacent one of the plurality of cathode µbumps, wherein the insulated area has a size of greater than 80 µm.

16. The CMOS layout of claim 11, further comprising an insulated area on the cathode current redistribution ring adjacent one of the plurality of cathode ubumps, wherein the insulated area is at least 10 µm away from one of the plurality of cathode ubumps.

17. The CMOS layout of claim 11, further comprising an insulated area on the cathode current redistribution ring adjacent one of the plurality of cathode µbumps, wherein the insulated area comprises a dielectric material.

18. The CMOS layout of claim 11, wherein the alternating $V_{led}$ contact areas and cathode contact areas are uniformly dispersed along the first side, the second side, the third side, and the fourth side of the power plane.

* * * * *

UNITED STATES PATENT AND TRADEMARK OFFICE
CERTIFICATE OF CORRECTION

PATENT NO. : 12,431,478 B2  
APPLICATION NO. : 17/947327  
DATED : September 30, 2025  
INVENTOR(S) : Toni Lopez Page 1 of 1

It is certified that error appears in the above-identified patent and that said Letters Patent is hereby corrected as shown below:

In the Claims

Column 19, Line 14, Claim 2, replace "Vied" after "supply voltage" and before "interleaved" with "$V_{led}$".

Signed and Sealed this  
Eighteenth Day of November, 2025

John A. Squires  
*Director of the United States Patent and Trademark Office*